United States Patent [19]

Gillingham

[11] Patent Number: 5,708,619
[45] Date of Patent: *Jan. 13, 1998

[54] COLUMN REDUNDANCY SCHEME FOR DRAM USING NORMAL AND REDUNDANT COLUMN DECODERS PROGRAMMED WITH DEFECTIVE ARRAY ADDRESS AND DEFECTIVE COLUMN ADDRESS

[75] Inventor: Peter B. Gillingham, Kanata, Canada

[73] Assignee: Mosaid Technologies Incorporated, Kanata, Canada

[*] Notice: The term of this patent shall not extend beyond the expiration date of Pat. No. 5,469,401.

[21] Appl. No.: 560,547

[22] Filed: Nov. 17, 1995

Related U.S. Application Data

[63] Continuation of Ser. No. 913,183, Jul. 14, 1992, Pat. No. 5,469,401.
[51] Int. Cl.$^6$ ............................................. G11C 7/00
[52] U.S. Cl. ........................... 365/230.06; 365/230.03; 365/200; 365/225.7; 371/10.3
[58] Field of Search ....................... 365/230.06, 230.03, 365/200, 225.7; 371/10.2, 10.3

[56] References Cited

U.S. PATENT DOCUMENTS

| | | | |
|---|---|---|---|
| 4,807,191 | 2/1989 | Flannagan | 371/10.3 |
| 5,272,672 | 12/1993 | Ogihara | 365/200 |
| 5,325,334 | 6/1994 | Roh et al. | 365/201 |

*Primary Examiner*—David C. Nelms
*Assistant Examiner*—Andrew Q. Tran
*Attorney, Agent, or Firm*—Pascal & Associates

[57] ABSTRACT

A random access memory comprising rowlines and columns crossing the rowlines, memory cells being associated with crossings of rowlines and columns; apparatus for connecting the memory cells to columns from voltage carried on the rowlines, the rowlines, columns and memory cells being arranged in more than two adjacent arrays; a column decoder providing access apparatus to columns in all the arrays; apparatus to disable the column access in any or all arrays and apparatus to enable a replacement spare column or columns using a spare column decoder in any or all of the arrays.

7 Claims, 3 Drawing Sheets

COLUMN REDUNDANCY SCHEME FOR DRAM USING NORMAL AND REDUNDANT COLUMN DECODERS PROGRAMMED WITH DEFECTIVE ARRAY ADDRESS AND DEFECTIVE COLUMN ADDRESS

This is a continuation of application Ser. No. 07/913,183 filed Jul. 14, 1992, now U.S. Pat. No. 5,469,401.

FIELD OF THE INVENTION

This invention relates to dynamic random access memories (DRAMs) and in particular to a flexible and efficient structure for substituting redundant columns for defective columns in a large memory.

BACKGROUND TO THE INVENTION

Semiconductor DRAMs are typically formed of rowlines and columns crossing the rowlines. Capacitors adjacent each crossing of the rowlines and columns store charge, designating the data to be stored, and are switched to the columns in order to receive or discharge charge upon receipt of an appropriate voltage on the rowlines. The rowlines and columns are selected so as to read and write to particular capacitors by means of row (or X) decoders and column (or Y) decoders.

There are sometimes physical faults associated with the columns or associated elements. For this reason DRAMs usually contain redundant (spare) columns, which involves the provision of extra memory elements and column circuitry (columns). The extra memory and required redundant decoders to access that memory in place of defective columns uses valuable semiconductor chip area and decreases the efficiency of the memory.

DESCRIPTION OF THE PRIOR ART

Larger memories are typically subdivided into arrays of rowlines and columns. Earlier generations physically placed one sub-array on each side of a column decoder array; the column decoders accessed the columns in each of the adjacent sub-arrays. The memory was divided into blocks, each block being formed of two sub-arrays located on either side of the column decoder. Redundant columns and column decoders were placed at a location usually at one end of the each block. The address of a defective column must be programmed into a redundant decoder in order to enable a redundant column whenever the address of a defective column is received. The defective column is also disabled, either electrically using the output of the redundant decoder, or physically with a local fuse, for example as described in copending U.S. patent application Ser. No. 07/680,995 filed Apr. 5th, 1991, now U.S. Pat. No. 5,245,576, invented by Richard Foss et al. The amount of additional memory set aside for redundant columns is given by the expression $$M = B*E*A*O*DB*N \text{ bits/column}$$

where

B is the number of blocks in the chip (i.e.) the number of Y-decoder arrays

E is the number of redundant decoders in each block (determines the number of random defects which can be corrected)

A is the number of arrays in each block controlled by a single Y-decoder array

O is the number of final outputs per Y-decoder (which is greater than 1 if additional decoding is done in the final stage)

DB is the number of databuses/array (or the number of columns each final decoder output enables)

N is the number of bits per column.

In a 1 Mbit generation DRAM there may be 2 blocks, each having a dedicated array of Y-decoders with redundant decoders, 2 arrays in each block, 2 outputs per Y-decoder, and 2 databuses per array. This results in 8k of overhead for redundancy, less than 1% of memory capacity.

In 16 Mbit DRAM technology, an additional layer of interconnect may be available which would allow Y-decoders to be shared among more than two arrays. It is also possible to split the arrays to allow a global Y-decoder output to be routed, even if the additional layer of interconnect is not available. This reduces the number of Y-decoders required over what would have otherwise been necessary. Reducing the number of Y-decoders saves considerable area on the chip, an estimated 15-20%. However if the same level of redundancy is utilized to overcome defects as in the 1 Mbit memory size, the redundancy overhead will be much greater. Databus width must also be larger in 16 Mbit memories to meet the specification requirements such as the requirement for a test mode. It has been calculated that if there are four blocks with 16 arrays each, the redundancy overhead is 4 Mbits, or 25% of the memory. Chip area saved in reducing the number of column decoders is exceeded by additional redundant memory resulting from increased redundant block granularity; i.e. the minimum number of columns that can be replaced.

Techniques for reducing the number of redundant decoders is described in the article "A Flexible Redundancy Technique for High Density DRAMs" by M. Horiguchi et al, IEEE Journal of Solid State Circuits, January 1991, p. 12-17. However these techniques address the problem of reducing at the number of redundant decoders in memories composed of smaller blocks, but to not reduce the amount of redundant memory required. The technique, if applied to a memory having many sub-arrays associated with a single column decoder, would put out of service columns associated with arrays other than the one containing the defective column. As an example, where four arrays are accessed by a single column decoder, and only the memory associated with one of the arrays were defective, by disabling the column decoder the memory associated with all four arrays would be put out of service. While four spare array segments accessed by a redundant column decoder might replace the four taken out of service (of which three were good and only one defective), the redundant memory in the three good arrays is wasted to repair a defect in one bad array. There are two key disadvantages to this: (1) the area required for redundant columns is increased, and (2) the probability of a defect in the replacement columns increases as the size of the replacement block increases. Clearly the architecture proposed in the aforenoted publication is not suitable for multi-array memory blocks associated with a single array of column decoders as used in 16 Mbit and larger memory architectures.

SUMMARY OF THE PRESENT INVENTION

In the present invention the address of the array of the redundant column in the multi-array architecture described above is programmed in the redundant column decoders. The array address in addition to the defective column address in the normal decoder which was to access the defective column(s) is also programmed so that it will be disabled when the defective array is active, by blowing fuses in its circuitry. As a result redundant decoders may be flexibly assigned to decode for only a group of columns associated with a single array, rather than all arrays. The result is that a significantly reduced number of redundant decoders is required.

In accordance with an embodiment of the invention, a dynamic random access memory (DRAM) is comprised of rowlines and columns crossing the rowlines, memory cells being associated with crossings of rowlines and columns; apparatus for connecting the memory cells to the columns resulting from voltage carried on the rowlines; the rowlines, columns and memory cells being arranged in parallel arrays; a column decoder array for enabling each of the columns in the arrays; at least one spare common column in each of the arrays; plural spare decoders connected to at least one spare column, the number of spare decoders being less than or equal to the number of arrays multiplied by the number of spare columns per array, and apparatus for substituting a spare column for a defective column in an array.

It is preferred that an active spare decoder should contain the address of the array of the defective column in addition to the defective column address. The normal decoder should be electronically disabled when the faulty array is active. The spare column(s) in a redundant array thus is enabled in place of the disabled defective column(s) in the same array.

In accordance with another embodiment, a dynamic random access memory (DRAM) is comprised of plural memory element arrays associated with a single column decoder array, and at least one redundant memory column in each memory element array, and at least one redundant column decoder, the redundant column decoder comprising a column address input and an array address input, the array address input being programmed with the array address of a defective column, whereby memory associated only with an array address programmed in the redundant column decoder is substituted for a defective array column.

In accordance with an embodiment of the invention, a random access memory is comprised of rowlines and columns crossing the rowlines, memory cells being associated with crossings of rowlines and columns; apparatus for connecting the memory cells to columns from voltage carried on the rowlines, the rowlines, columns and memory cells being arranged in more than two adjacent arrays; a column decoder providing access apparatus to columns in all the arrays; apparatus to disable the column access in any or all arrays and apparatus to enable a replacement spare column or columns using a spare column decoder in any or all of the arrays.

The transistors described herein are preferred to be MOS field effect transistors, their N or P channel polarity types being evident from the drawings.

BRIEF INTRODUCTION TO THE DRAWINGS

A better understanding of the invention will be obtained by reference to the detailed description below, in conjunction with the following drawings, in which:

FIG. 1 illustrates the architecture of a prior art DRAM of 1 Mbit size,

FIG. 2 illustrates a portion of the multiple arrays in a single block of a larger memory, according to the present invention, FIG. 3 is a logic diagram of a normal column decoder as may be used in the present invention, FIG. 4 is a schematic diagram of a fused NOR gate that is preferred to be used in the present invention, and FIG. 5 is a logic diagram of a redundant column decoder as may be used in the present invention.

DESCRIPTION OF THE PREFERRED EMBODIMENT

Figure 1:
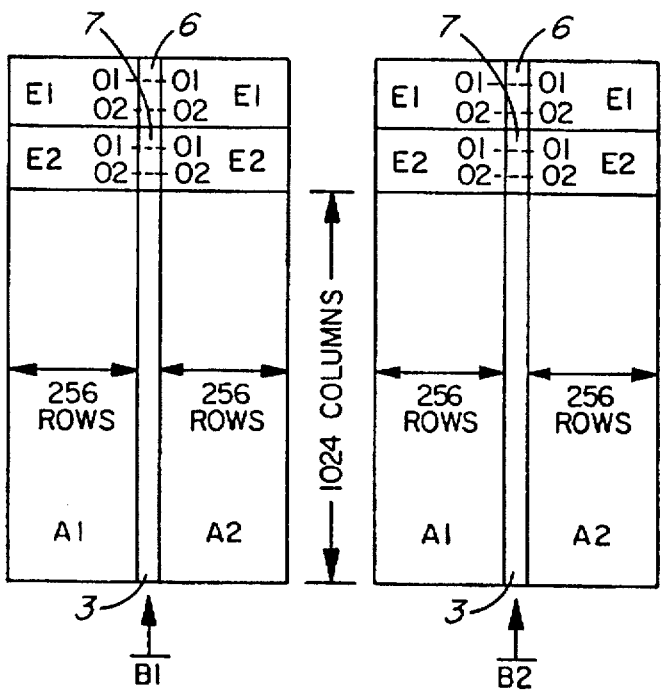

An example 1 Mbit memory architecture shown in FIG. 1 is comprised of two blocks B1 and B2 of memory, each block being comprised of two sub-arrays A1 and A2 located on either side of a column decoder array 3. Each sub-array is formed of 256 rows and 1,024 columns. The structure of the rows and columns is well known, and may be reviewed in a general textbook on semiconductor memories, such as in MICROCOMPUTER PRIMER by Mitchell Waite and Michael Pardee, Howard W. Samms & Co. Inc.

At the end of each block are located two groups of redundant columns E1 and E2 on each side of associated redundant column decoders 6 and 7. Each group of columns in each array is comprised of two sets of columns each enabled by column decoder final outputs labelled as O1, O2. Of course as many redundant columns as may be desired to overcome a certain level of defective columns in the main memory may be used, rather than merely the two groups shown.

Each redundant column is associated with redundant memory. The amount of additional memory set aside for replacement columns is given by the expression noted earlier:

$$M=B*E*A*O*DB*256 \text{ bits/column}$$

In the above example, where there are two blocks, each having a dedicated array of column decoders with two redundant decoders, and two sub-arrays in each block, with two outputs per column decoder to access each of the pair of columns associated with each of two databuses per sub-array, there is 8K of overhead for redundancy, less than 1% memory capacity.

For the 16 Mbit size of memory, where the array size is the same as in the 1 Mbit example, but where four column decoders are shared by sixteen sub-arrays, and the requirement for parallel test mode increases the size of the databus to 8 bits, and per-array defect coverage remains the same as in the 1 Mbit example, B=4, E=16, A=16, O=2 and DB=8. The redundancy overhead calculates to 4 Mbits, or 25% of the memory. Thus the semiconductor chip area saved in reducing the number of column decoders by utilizing 16 arrays in each of the four blocks is exceeded by additional redundant memory resulting from the requirement of increased redundant block granularity.

Figure 2:
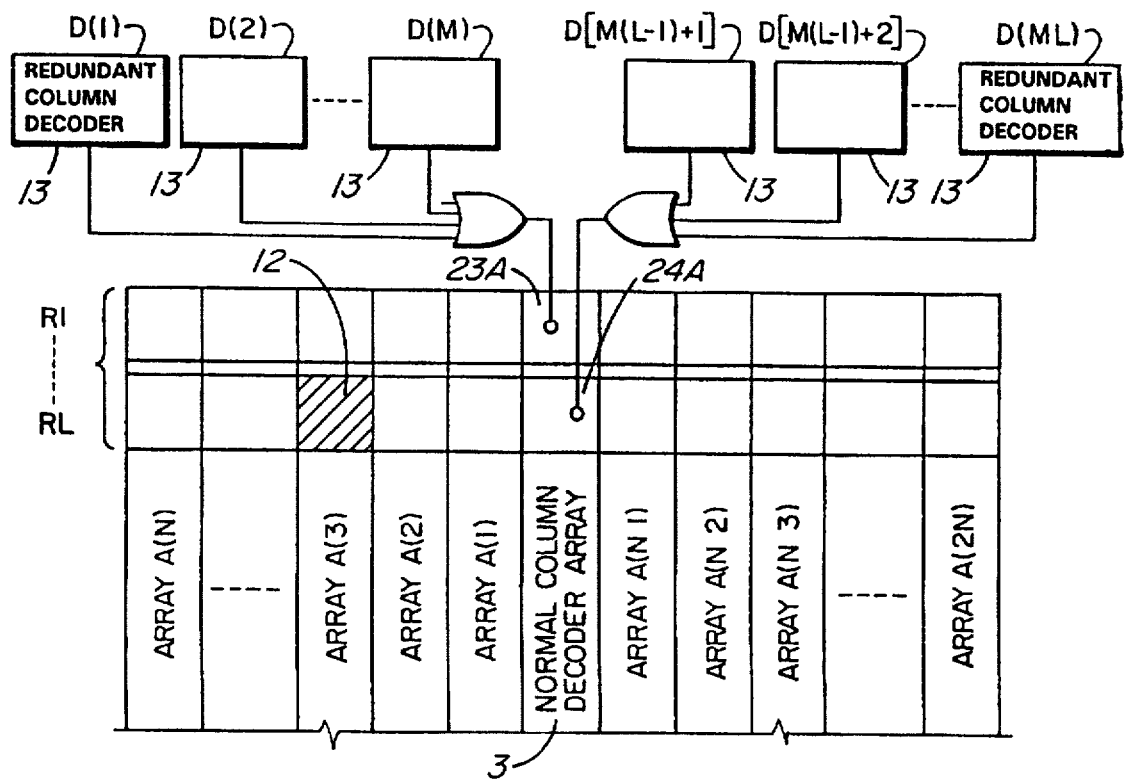

FIG. 2 illustrates the portion of a larger memory block utilizing multiply arrays on each side of column decoders. Arrays A(1)–A(N) are located on one side of an array of column decoders 3, and memory arrays A(N+1)–A(2N) are located on the other side. Redundant columns R(1)–R(L) are located at one end of the block.

It may be seen that in this architecture, 2N arrays share a single column decoder array.

In accordance with the present invention, redundant decoders D(1)–D(ML) are utilized to enable specific redundant columns associated with particular arrays in the block.

The redundant column decoders contain the address of both the defective column and the array address defining the array in which the defective column is located. The normal column decoder associated with a defective array is selectively disabled by fuses programmed with the defective array address. Speed of operation is not affected because the array address is available well before the columns are accessed, and the decoder can be electrically disabled depending on the array address.

The redundant decoders can be flexibly assigned to enable a redundant column associated with a particular array, reducing the total number of redundant decoders required on the chip. By including the array address in the redundant column decoders, the total number of redundant decoders required on the chip is reduced, since each redundant decoder can be programmed to take effect for more than one array address.

In accordance with the present invention 2N arrays share a single column decoder array. ML redundant column decoders enable 2NL sections of redundant columns. One of the redundant column sections accessed by a single redundant decoder in replacement of a defective array is illustrated shaded, referenced 12.

In one implementation, ML redundant column decoders can enable L groups of spare columns in each of 2N arrays. In this case M=2N.

However in accordance with the present invention, in which the array address is programmed in the redundant column decoders, M can be made less than 2N, thus reducing the number of redundant decoders while not limiting the number of faults that can be corrected in any one array. Thus the semiconductor chip area wasted in the redundant decoders can be optimized for a desired level of fault coverage.

Comparing the amount of redundant memory based on the previous 16 Mbit example, where one defect per sub-array is to be repaired, the value of E need no longer equal the number of redundant decoders (B=4, E=1, A=16, O=2, and DB=8). Thus the redundant memory size is reduced to 256K, or 1.6% of the memory, rather than 25% of the memory as would be the case using prior art techniques. This is a significant achievement of the present invention.

Figure 3:
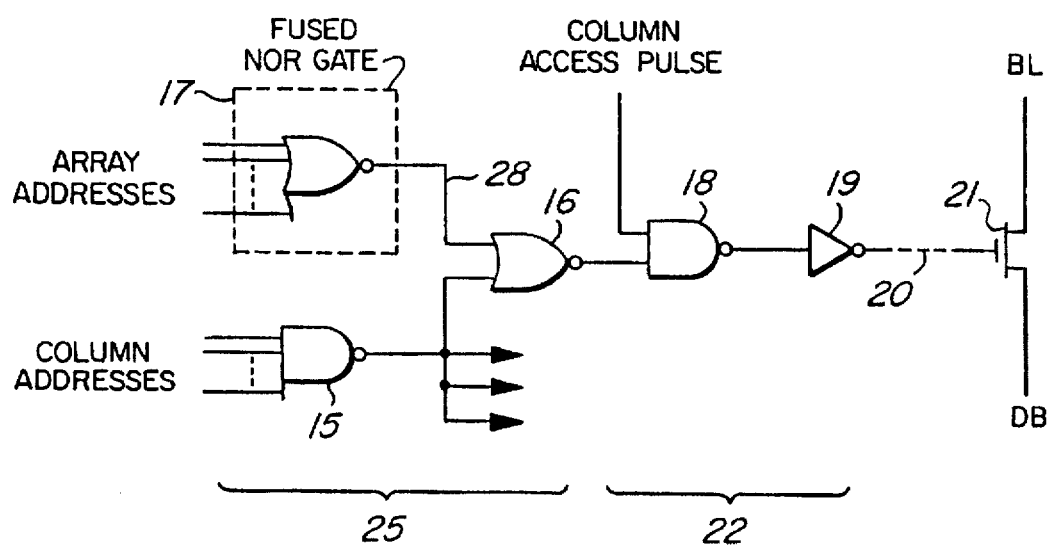

FIG. 3 illustrates a logic diagram of a normal column decoder that can be used to implement the present invention which is selectively disabled on a per array basis by fuse blowing. A NAND gate 15 receives column addresses at its inputs and presents its output to an input of NOR gate 16.

A fused NOR gate 17 receives array addresses to selectively disable the column decoder when an array address programmed by blowing appropriate fuses is recognized. The output of NOR gate 17 is applied to another input of NOR gate 16.

The output of NOR gate 16 is applied to an input of NAND gate 18, another input of which is connected to a source of a bit line (column) access pulse. The output of NAND gate 18 is connected to an input of inverter 19. The output of inverter 19 is connected to the column 20, to which the gate of an access transistor 21 is connected whose source-drain circuit connects a bit line BL with a databus DB in a well known manner.

In operation, normally a column address received by NAND gate 15 coincident with a column access pulse enables the column causing transfer of charge between the bitline and databus, thus either reading or writing a bit from or to the bitline, to or from the databus.

In accordance with the present invention, however, the address of a particular array in which a group of replacement columns (i.e. that shaded group 12) is to be substituted for a defective column in a multi-array block is received by fused NOR gate 17. The address is compared in the fused NOR gate by means of fuse lines as will be described below. If the address matches, the output of NOR gate 17 will be a high logic level applied to NOR gate 16 thus disabling all subsequent stages of the normal column decoder and turning off access transistor 21, preventing read and write operation to the defective column.

It should be noted that only for the normal column described above is the decoder required to be physically located within the pitch-sensitive region of the block, i.e. in region 3 of FIG. 2. The redundant column decoder, referenced 13, is located outside the pitch-sensitive region.

Figure 4:
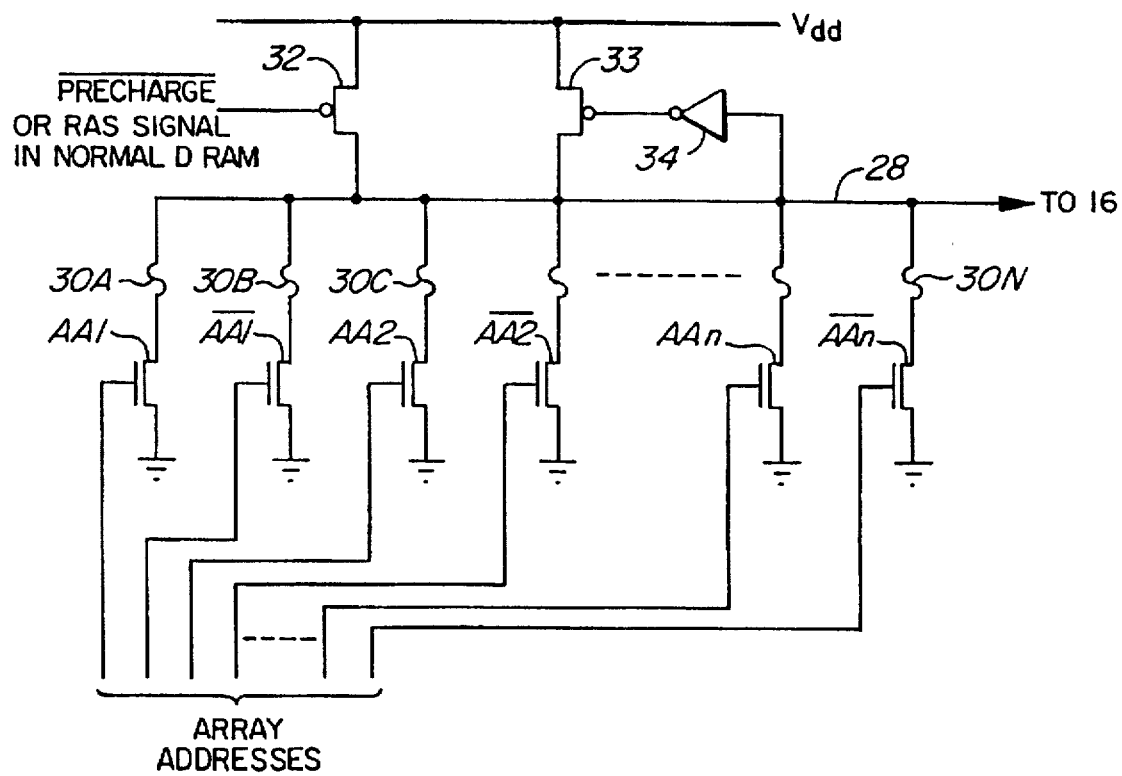

FIG. 4 illustrates a schematic diagram of a fused NOR gate that can be used as element 17 in the normal decoder, and as a corresponding element in the redundant decoder. A group of NMOS transistors AA1, /AA1, AA2, /AA2 . . . AAn, /AAn are connected in parallel between ground and output line 28. Connected in series with the source-drain circuit of each transistor is a fuse 30A–30N.

A PMOS transistor 32 has its source-drain circuit connected between output line 28 and power rail $V_{dd}$. Another PMOS transistor 33 having a small channel width has its source-drain circuit connected in parallel with transistor 32. An inverter 34 has its input connected to output line 28 and its output connected to the gate of transistor 33.

During the testing phase of the memory, it is determined that a particular array address is to be programmed into the NOR gate 17 to disable the normal column decoder. Fuses in the array 30A–30N associated with particular address lines are blown in a well known manner.

In operation, prior to addressing, an active low precharge signal is applied to a gate of transistor 32 while all addresses are inactive low. Transistor 32 begins conducting in its source-drain circuit as a result. Node 28 is thereby precharged to a $V_{dd}$ level. With the level $V_{dd}$ at line 28, and inversion in inverter 34, transistor 33 is enabled, latching line 28 to $V_{dd}$.

Following termination of precharge cycle, the address of the active array is applied to the gates of transistors AA1–/AAn. One of each pair of lines AA1 and /AA1, AA2 and /AA2 etc. will rise from $V_{ss}$ level to $V_{dd}$. If fuses corresponding to the array address have been blown, there will be no path from node 28 to $V_{ss}$, and the output of the fuse array will remain at $V_{dd}$, inhibiting the normal column decoder. If no fuses were blown, or the address is different from the fuse programmed address, a pulldown path will be enabled to discharge node 28 to $V_{ss}$, enabling normal operation of the normal column decoder.

Clearly the normal column decoder may be disabled for any particular array by blowing all the fuses corresponding to that particular array. In that case the output of the fused NOR gate 17 will remain at high level, inhibiting the output of the decoder.

Figure 5:
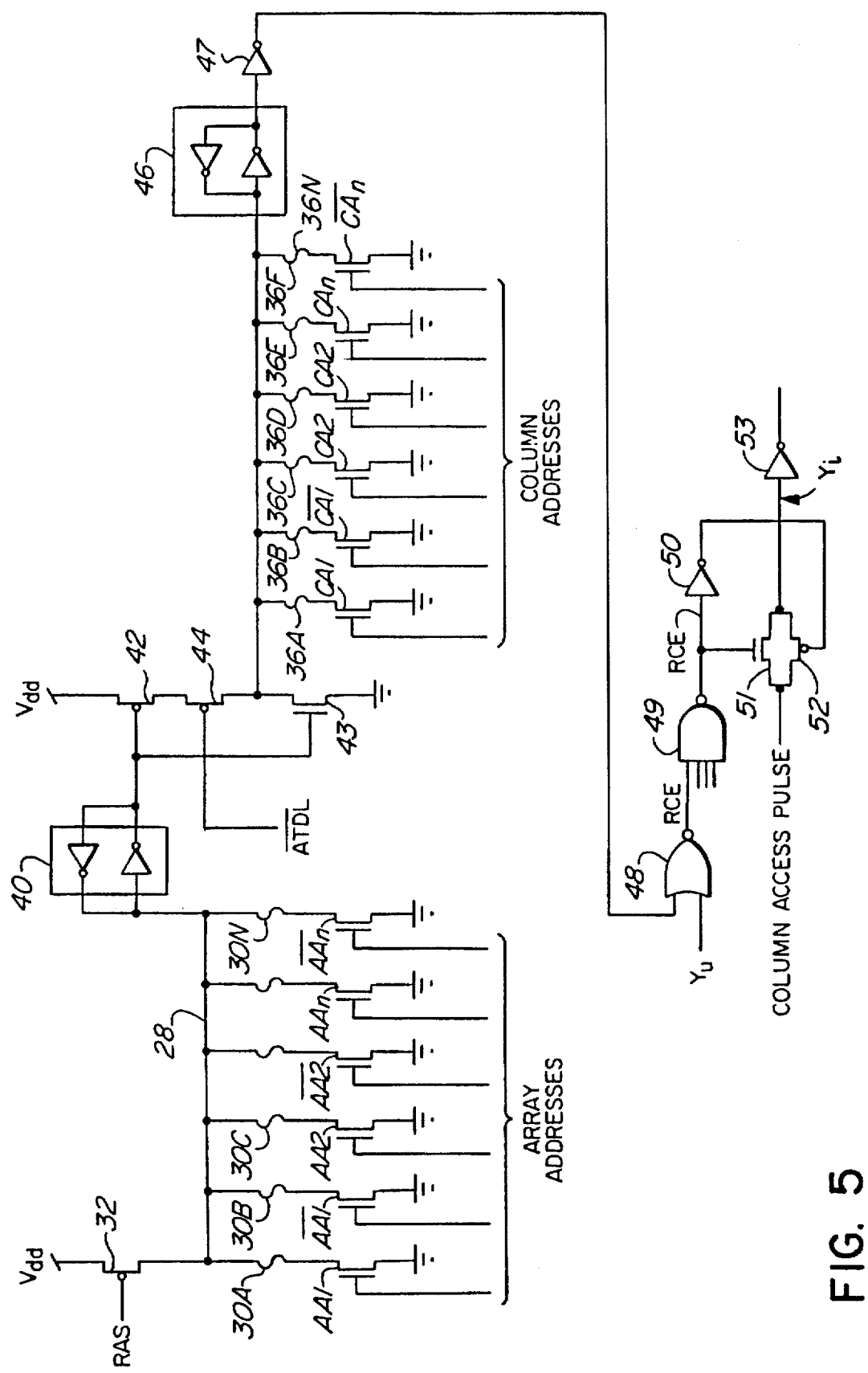

FIG. 5 is a logic diagram of a redundant column decoder. This decoder has a similar fused array address NOR gate as in the embodiment of FIG. 3, but is shown in more detail as in FIG. 4. Elements 30A–30N, AA1–/AAn and 32 correspond to those in FIG. 4, and operate in a similar manner as described above with respect to FIG. 4.

A similar fused column address distinguishing structure is also included, comprising fuses 36A–36N all connected to a bus 38 at one end, and connected individually to transistors CA1–/CAn, which are also connected to ground (or $V_{ss}$). The gates of each of the transistors CA1–/CAN are connected to a source of column address signals. Thus transistors AA1–/AAN, form effectively an OR gate receiving array addresses, and transistors CA1–/CAN form an effective OR gate receiving column addresses.

Latch 40, shown formed of a parallel pair of oppositely connected inverters, connect the line or bus 28 to the gate of PMOS transistor 42, and to the gate of NMOS transistor 43. The source-drain circuit of transistor 42 is connected to $V_{dd}$ and to the source-drain circuit of PMOS transistor 44, which is also connected to bus 38 and to the source-drain circuit of transistor 43, which is connected to ground $V_{ss}$. The gate of transistor 44 is connected to a pulse source/ATDL.

Bus 38 is connected through latch 46 and inverter 47 to one input of NOR gate 48, which has its output connected to one input of NAND gate 49. The other input of NOR gate 48 is connected to a logic source Yu. The output of NAND gate 49 is connected to the input of an inverter 50 and to the gate of an NMOS transistor 51. The output of inverter 50 is connected to the gate of a PMOS transistor 52. The source-drain circuits of transistors 51, 52 are connected in parallel, one end being connected to a column access pulse source and the other to an output inverter 53. Inverter 53 corresponds to inverter 19 in FIG. 3 and its input is driven from a column access pulse corresponding to the one shown in FIG. 3 which is input to NAND gate 18.

In operation the column address enabling is similar to the array address enabling, as described with reference to FIG. 3. Transistor 42 corresponds to transistor 33 of FIG. 4 but provides precharge to bus 38, is enabled in a similar manner, and is latched on through latch 40. The logic high voltage $V_{dd}$ is provided to the bus 38 through transistors 42 and 44 upon receiving an ATDL pulse at the gate of transistor 44, which causes precharging of bus 38 at the start of a column cycle. Depending on whether the address corresponds to those transistors in which the fuses were not blown, the bus 38 is either pulled low or allowed to remain high.

The circuit thus provides the function of a fused NOR gate for the array addresses and a fused NOR gate for the column addresses.

This is latched by latch 46 and is applied through inverter 47, NOR gate 48, NAND gate 49 (redundant column enable (RCE) and to the final stage in the pitch of the array comprising inverter 50 and transistors 51 and 52, the output of inverter 53 being equivalent to the output of inverter 19 of FIG. 3.

It should also be noted that the output stage comprised of inverters 50 and 53 and transistors 51 and 52 could be used in place of AND gate 18 and inverter 19 in the embodiment of FIG. 3.

The address of a particular defective column must be programmed into a selected redundant column decoder so that a group of redundant columns will function in place of the disabled columns. The speed critical path of the column decoder is not affected by the fused NOR gate because the array addresses are set up well in advance of the column addresses. Indeed the column addresses themselves are usually set up before the access pulse is generated.

By the use of the above-described invention, the amount of redundant memory is minimized when column decoders are shared by many arrays. This method is equivalent in speed to physical disconnection of normal column decoders since local fuses rather than a normal column disable signal generated by the redundant decoder disables the normal decoders. No additional stages of logic in the critical decoding path are required.

A person understanding this invention may now conceive of alternative structures and embodiments or variations of the above. All of those which fall within the scope of the claims appended hereto are considered to be part of the present invention.

I claim:

1. A dynamic random access memory (DRAM) comprising plural adjacent memory element arrays logically coupled to a single column decoder array, and comprising at least one redundant memory column in each memory element array and at least one redundant column decoder in said column decoder array coupled to plural redundant columns for enabling one of said redundant columns, the redundant column decoder comprising a column address input and an array address input, the array address input being programmed with the array address of a defective column(s), and programmable fused circuits logically coupled to at least one normal column decoder for disabling a particular array address of said at least one normal column decoder, whereby memory cells of a redundant column associated only with a single memory element array are substituted for a defective column, in which the redundant column decoder is comprised of a first fused NOR gate for receiving said array address and for providing an output signal representing an array address received enable signal if the received array address matches plural unblown fuse lines therein, in which the column address input is programmed with the column address of a defective column, and further including a second fused NOR gate for receiving column addresses and producing a redundant column enable signal when a column address matches the programmed address of the defective column.

2. A dynamic random access memory (DRAM) comprising plural adjacent memory element arrays logically coupled to a single column decoder array, and comprising at least one redundant memory column in each memory element array and at least one redundant column decoder in said column decoder array coupled to plural redundant columns for enabling one of said redundant columns, the redundant column decoder comprising a column address input and an array address input, the array address input being programmed with the array address of a defective column(s), and programmable fused circuits logically coupled to at least one normal column decoder for disabling a particular array address of said at least one normal column decoder, whereby memory cells of a redundant column associated only with a single memory element array are substituted for a defective column, in which the redundant column decoder is comprised of a first fused NOR gate for receiving said array address and for providing an output signal representing an array address received enable signal if the received array address matches plural unblown fuse lines therein, and in which the first fused NOR gate is comprised of a group of MOS transistors of a first channel conductivity type equal in number to a number of lines for carrying both polarities of each array address, the transistors having their source-drain circuits connected between ground potential and through individual programming fuses to an output line for providing said output signal, means for providing said array address to the gates of said transistors, a first and a small channel width transistor each having a second channel conductivity type opposite to that of said group of MOS transistors having their source-drain circuits connected in parallel between the output line and a voltage rail $V_{dd}$, an inverter having its input connected to the output line and its output connected to the gate of the small channel width transistor, and means for receiving a precharge enable signal at the gate of said first transistor.

3. A dynamic random access memory (DRAM) comprising plural adjacent memory element arrays logically coupled to a single column decoder array, and comprising at least one redundant memory column in each memory element array and at least one redundant column decoder in said column decoder array coupled to plural redundant columns for enabling one of said redundant columns, the redundant column decoder comprising a column address input and an array address input, the array address input being programmed with the array address of a defective column(s), and programmable fused circuits logically coupled to at least one normal column decoder for disabling a particular array address of said at least one normal column decoder, whereby memory cells of a redundant column associated only with a single memory element array are substituted for a defective column, the programmable fused circuits being comprised of fused NOR gate means for disabling said at least one normal column decoder in any of the memory element arrays.

4. A dynamic random access memory comprising rowlines and columns crossing the rowlines, memory cells being associated with crossings of rowlines and columns; means for connecting the memory cells to columns under control of voltage carried on the rowlines, the rowlines, columns and memory cells being arranged in more than two adjacent arrays; fused circuit column decoder means containing serial fuses in address inputs thereof logically coupled to columns in all the arrays; programmable fuses logically coupled to said column decoder means for disabling particular block addresses of column decoders in any or all arrays of said column decoder means, and redundant column decoder means each containing the address of an array and of a defective column of the array coupled to a replacement spare column or columns for enabling a replacement spare column or columns using a spare column decoder in any or all of the arrays when the defective column is addressed.

5. A dynamic random access memory (DRAM) comprising rowlines and columns crossing the rowlines, memory cells being associated with crossings of rowlines and columns; means for connecting the memory cells to the columns under control of voltage carried on the rowlines; the rowlines, columns and memory cells being arranged in parallel arrays; a column decoder array logically coupled to the columns for enabling each of the columns in the arrays; at least one spare common column in each of said arrays; plural spare decoders connected to said at least one spare common column, the number of spare decoders being less than or equal to the number of arrays multiplied by the number of spare columns per array; means logically coupled to the columns for substituting a spare column for a defective column in an array; one of the spare decoders being an active spare decoder containing an address of an array having a defective column and the defective column address, programmable fuses logically coupled to the column decoders of said column decoder array for disabling the column decoders for particular array addresses, whereby the spare column in a redundant array corresponding to said array address is enabled in place of the disabled defective column in the same array.

6. A dynamic random access memory (DRAM) comprising plural adjacent memory element arrays logically coupled to a single column decoder array, and comprising at least one redundant memory column in each memory element array and at least one redundant column decoder in said column decoder array coupled to plural redundant columns for enabling one of said redundant columns, the redundant column decoder comprising a column address input and an array address input, the array address input being programmed with the array address of a defective column(s), and programmable fused circuits logically coupled to at least one normal column decoder for disabling a particular array address of said at least one normal column decoder, whereby memory cells of a redundant column associated only with a single memory element array are substituted for a defective column, and said redundant column decoder further including:

(a) means for receiving an array or column address, (b) a multi-stage decoder having at lest one preceding decoder stage serially connected to a final decoding stage for receiving and decoding said array or column address, each stage of which receives a portion of said address for decoding thereof, (c) at least one said fused circuits in said at least one stage preceding said final decoding stage, (d) means in said at least one preceding stage, connected to the fuses of said fused circuits and connected to said final stage, for maintaining said final stage inoperative upon the fuse being open circuited, and for maintaining said preceding and said final stage operative upon the fuse being conductive, whereby the redundant column decoder is maintained inoperative or operative depending on whether the fuse is open circuited or not.

7. A dynamic random access memory (DRAM) comprising plural adjacent memory element arrays logically coupled to a single column decoder array, and comprising at least one redundant memory column in each memory element array and at least one redundant column decoder in said column decoder array coupled to plural redundant columns for enabling one of said redundant columns, the redundant column decoder comprising a column address input and an array address input, the array address input being programmed with the array address of a defective column(s), and programmable fused circuits logically coupled to at least one normal column decoder for disabling a particular array address of said at least one normal column decoder, whereby memory cells of a redundant column associated only with a single memory element array are substituted for a defective column, and said redundant column decoder further including:

(a) means for receiving an array or column address, (b) a multi-stage decoder for receiving and decoding said array or column address having a final stage and at least one preceding stage, said stages being serially connected and each receiving a portion of said address for decoding, (c) means in said preceding stage for raising or lowering an input voltage to said final stage to cause said final stage to pass or block signals therethrough, upon said preceding stage receiving said address, and (d) said fused circuits being connected in said preceding stage for permanently changing the input voltage to said final stage for causing said final stage to permanently block signals therethrough when a fuse in said fused circuits is blown.

* * * * *